United States Patent [19]

Maemura et al.

[11] Patent Number: 5,548,825
[45] Date of Patent: Aug. 20, 1996

[54] RADIO TRANSMITTER WITH ACTIVE BAND-PASS FILTERING

[75] Inventors: Kosei Maemura; Kazuya Yamamoto, both of Itami, Japan

[73] Assignee: Mitsubishi Denki Kabushiki Kaisha, Tokyo, Japan

[21] Appl. No.: 269,219

[22] Filed: Jun. 30, 1994

[30] Foreign Application Priority Data

Jul. 6, 1993 [JP] Japan ..................... 5-166620

[51] Int. Cl.⁶ ........................................ H03C 1/62
[52] U.S. Cl. ..................... 455/115; 455/76; 455/113; 455/116; 455/125
[58] Field of Search ..................... 455/120, 124, 455/125, 126, 127, 103, 115, 116, 113, 114, 63, 117, 76

[56] References Cited

U.S. PATENT DOCUMENTS

| | | | |
|---|---|---|---|
| 3,355,667 | 11/1967 | Bruene | 455/123 |
| 3,649,909 | 3/1972 | Ort et al. | 324/77 E |
| 4,025,855 | 5/1977 | Atkinson | 455/109 |
| 4,521,913 | 6/1985 | Huber et al. | 455/121 |
| 4,723,306 | 5/1986 | Fuenfgelder et al. | 455/103 |
| 5,270,669 | 12/1993 | Jokura | 331/2 |
| 5,361,403 | 11/1994 | Dent | 455/74 |
| 5,376,895 | 12/1994 | Aihara | 330/129 |

FOREIGN PATENT DOCUMENTS

| | | |
|---|---|---|
| 438257 | 1/1991 | European Pat. Off. . |
| 56058305 | 10/1979 | Japan . |
| 62-193420 | 8/1987 | Japan . |
| 63-67923 | 3/1988 | Japan . |
| 1-166624 | 6/1989 | Japan . |
| 0246923 | 10/1989 | Japan ..................... 455/126 |
| 2238193 | 10/1990 | United Kingdom . |

*Primary Examiner*—Reinhard J. Eisenzopf
*Assistant Examiner*—Lee Nguyen
*Attorney, Agent, or Firm*—Leydig, Voit & Mayer

[57] ABSTRACT

A transmitter of a radio communication apparatus includes a voltage controlled oscillator for converting a voltage signal input to the transmitter into a signal having a frequency according to the voltage of the voltage signal, a mixer for mixing a signal having a fixed frequency with the converted input signal and generating a signal for transmission having a frequency at which communication is substantially carried out, a frequency detector for detecting the frequency at which communication is substantially carried out, and a filter for eliminating useless signals that are included in the signal for transmission and have frequencies different from the frequency at which communication is substantially carried out. Signals having frequencies different from the frequency at which communication is substantially carried out are not radiated into space. As a result, this radio communication apparatus does not cause noise in other communication apparatus of the same kind using communication frequencies different from that of this apparatus.

3 Claims, 9 Drawing Sheets

5,548,825

RADIO TRANSMITTER WITH ACTIVE BAND-PASS FILTERING

FIELD OF THE INVENTION

The present invention relates to a radio communication apparatus and, more particularly, to a transmitter included in the radio communication apparatus that does not transmit signals having frequencies other than specific frequencies at which the radio communication is carried out.

BACKGROUND OF THE INVENTION

FIG. 17 is a circuit diagram illustrating a transmitter of a conventional radio communication apparatus. In FIG. 17, a voltage controlled oscillator 17 receives an input signal S1 and outputs a signal S11 having a frequency in proportion to the voltage. A frequency synthesizer 16 generates a signal S12 for converting the signal S11 into a signal having a frequency to be transmitted. The signal S11 from the voltage controlled oscillator 17 and the signal S12 from the frequency synthesizer are input to a mixer 15. The mixer 15 compounds these signals and outputs a signal S13 to a voltage amplifier 14. The voltage amplifier 14 amplifies the signal S13 and outputs a signal S14. The signal S14 passes through a filter 13. The filter 13 eliminates a signal component of having an unnecessary frequency from the signal S14 and outputs a signal S14a. The signal S14a is radiated into space from an antenna 11 as a signal S2. A transmit-receive switch (hereinafter referred to as TR switch) 12 is interposed between the filter 13 and the antenna 11.

In radio communication systems, communication apparatus of different kinds have different frequency bands for communication (hereinafter referred to as usable frequency bands). If an automobile telephone having a usable frequency band ranging from 900 MHz to 920 MHz transmits signals having frequencies outside this range, these signals cause noise on a radio communication apparatus having a usable frequency band including the frequencies.

On the other hand, in radio communication using the same radio communication apparatus, each person uses his own frequency range in the usable frequency band of the communication apparatus. For example, when a radio communication apparatus has a usable frequency band from 900 MHz to 920 MHz, if the frequency range for each person, i.e., each communication, is 100 KHz, two hundred and one radio communications are possible.

FIG. 18 illustrates input frequency vs. output voltage characteristics of the filter 13 of the radio transmitter 800 shown in FIG. 17. The usable frequency band of this radio transmitter ranges from 900 MHz to 920 MHz. As shown in FIG. 18, the filter 13 has a pass band for suppressing signals of frequencies that are not included in the usable frequency band (900 MHz–920 MHz) so that the radio transmitter does not cause noise in other kinds of radio communication apparatus. For example, in the radio transmitter 800 shown in FIG. 17, if a signal having a frequency of 700 MHz is output from the frequency synthesizer 16 and a signal having a frequency of 210 MHz is output from the voltage controlled oscillator 17, a signal having a frequency of 910 MHz (700 MHz+210 MHz) and a signal with a frequency of 1120 MHz (700 MHz+210 MHz×2) are output from the voltage amplifier 14. Since the signal having a frequency of 1120 MHz is eliminated by the filter 13, it is not radiated into space.

As described above, in the prior art radio communication apparatus, signals produced in the apparatus and having frequencies other than the usable frequency band of the apparatus are not radiated into space. However, the transmission signal generating means comprising the voltage controlled oscillator 17, the frequency synthesizer 16, and the mixer 15 generate weak signals, i.e., signals at low amplitude levels, having frequencies that are within the usable frequency band but are different from a substantial communication frequency. These signals are not eliminated by the filter 13. For example, in a communication apparatus having a usable frequency band of 900–920 MHz and operating at a frequency of 911 MHz, if signals having a frequency of 912 MHz are produced by the transmission signal generating means, these signals are transmitted together with signals of 911 MHz and cause noise of in other communications using the frequency of 912 MHz.

SUMMARY OF THE INVENTION

An object of the present invention is to provide a radio communication apparatus including a transmitter which does not transmit signals of frequencies that are within a usable frequency band of the radio communication apparatus but are different from a frequency at which communication is substantially performed.

Another object of the present invention is to provide a radio communication apparatus including a receiver which eliminates signals having frequencies that are within a usable frequency band of the radio communication apparatus but are different from a frequency at which communication is substantially carried out, and demodulates the remaining signals.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, in a transmitter of a radio communication apparatus, a frequency at which communication is substantially carried out (hereinafter referred to as substantial communication frequency) is detected from transmission signals comprising signals input to the transmitter and signals having a prescribed frequency for converting the input signals into signals having the substantial communication frequency, and signal components having frequencies other than the detected frequency are eliminated from the transmission frequencies. Therefore, this transmitter does not cause noise in other radio communication apparatuses using frequencies that are within the usable frequency range of this transmitter but are different from the substantial communication frequency.

According to a second aspect of the present invention, the substantial communication frequency is detected from an output signal of a loop filter included in a frequency synthesizer for generating a signal having a prescribed frequency, and signal components having frequencies other than the detected frequency are eliminated from the transmission signals. Therefore, this transmitter does not cause noise in other radio communication apparatus using frequencies that are within the usable frequency range of this transmitter but are different from the substantial communication frequency. In addition, means for detecting the substantial communication frequency from the transmission signals can be dispensed with.

According to a third aspect of the present invention, in a receiver of a radio communication apparatus, a substantial communication frequency is detected from an output signal of a loop filter included in a frequency synthesizer for generating a signal having a prescribed frequency that determines the substantial communication frequency, and signal components having frequencies other than the detected frequency are eliminated from received signals and, thereafter, the remaining signals are demodulated. Therefore, demodulated signals having no noise are produced.

DETAILED DESCRIPTION OF THE PREFERRED EMBODIMENTS

Figure 1:
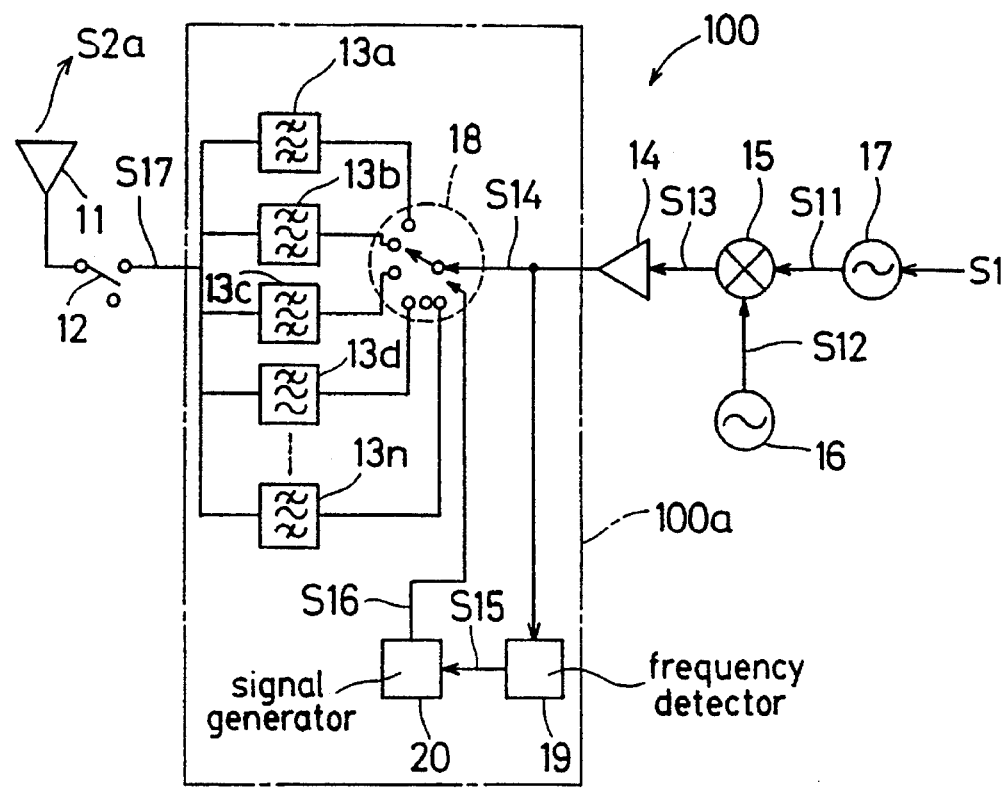
FIG. 1 is a circuit diagram illustrating a transmitter of a radio communication apparatus in accordance with a first embodiment of the present invention.

FIG. 1 is a circuit diagram illustrating a transmitter of a radio communication apparatus in accordance with a first embodiment of the present invention. In the figure, the same reference numerals as in FIG. 17 designate the same or corresponding parts. A transmitter 100 of this first embodiment includes a useless signal eliminating circuit 100a in place of the filter 13 of the prior art transmitter 800.

The useless signal eliminating circuit 100a includes a plurality of band-pass filters 13a to 13n having different pass bands, a switch circuit 18, a frequency detector 19, and a signal generator 20. The switch circuit 18 selects a filter to be connected to the voltage amplifier 14 from those filters 13a and 13n. The frequency detector 19 detects a substantial communication frequency from the signal S14 output from the voltage amplifier 14. The signal generator 20 generates a signal S16 that controls switching operation of the switch circuit 18 according to the output signal S15 from the frequency detector 19.

Figure 2:
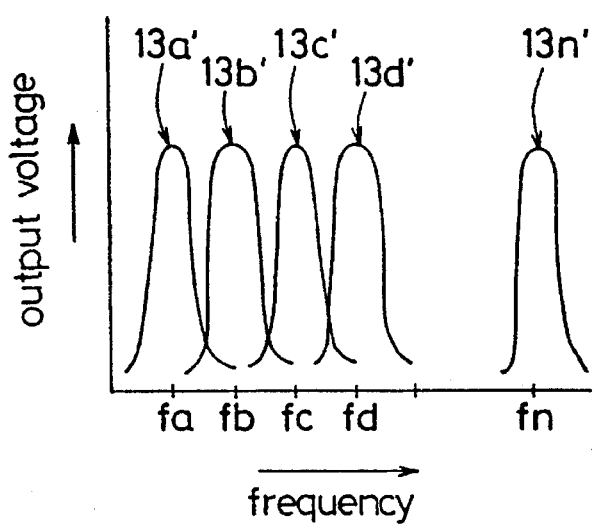
FIG. 2 is a diagram illustrating characteristics of band-pass filters included in the transmitter of FIG. 1.

FIG. 2 illustrates band-pass characteristics of the band-pass filters 13a to 13n, in which $f_a$ to $f_n$ indicate frequencies of signals used for communication (hereinafter referred to as communication frequencies) in the usable frequency band of the radio communication apparatus. As shown in FIG. 2, the width of the pass band of each band-pass filter is approximately equal to the interval between the adjacent communication frequencies, and the frequency in the center of the pass band corresponds to the a communication frequency.

Figure 3:
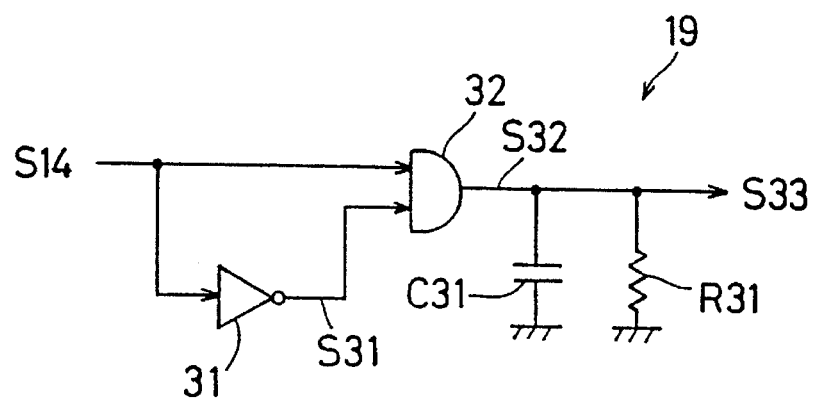
FIG. 3 is a circuit diagram illustrating a frequency detecting circuit included in the transmitter of FIG. 1.

FIG. 3 is a circuit diagram illustrating the frequency detector 19. The frequency detector 19 comprises a NOT circuit 31 to which the output signal S14 from the voltage amplifier 14 is applied, an AND circuit 32 to which the output signal S14 and an output signal S31 from the NOT circuit 31 are applied, a capacitor C31 inserted between the output end of the AND circuit 32 and ground, and a resistor R31 connected in parallel with the capacitor C31. Reference numeral S33 designates an output signal of the frequency detector 19 and corresponds to the signal S15 of FIG. 1.

Figure 4:
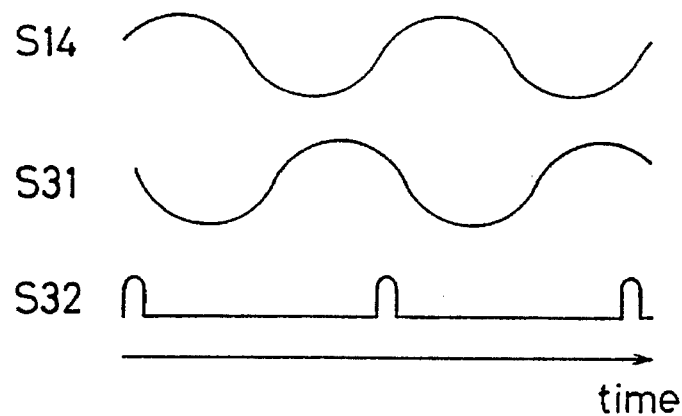
FIG. 4 is a diagram illustrating operating waveforms of the frequency detecting circuit shown in FIG. 3.

FIG. 4 illustrates waveforms of the respective signals S14, S31, and S32 of FIG. 3. As shown in FIG. 4, the pulse width of the signal S32 is determined correspond to the difference in phases between the signal S14 and the signal S31. The output signal S14 includes weak signals, i.e., signals at a low amplitude level, generated in the latter stage of the voltage amplifier and having a frequency that is within the usable frequency band but different from the substantial communication frequency. However, these signals are eliminated through the NOT circuit 31, so that the signal S32 output from the AND circuit 32 comprises only signals having the substantial communication frequency.

Figure 5:
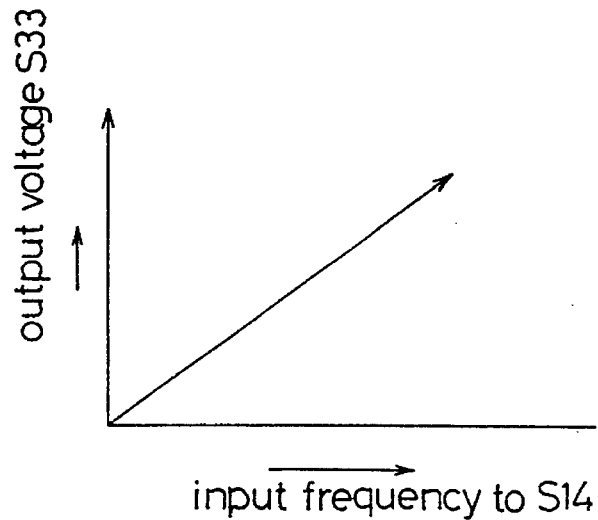
FIG. 5 is a diagram illustrating the relationship between input frequency and output voltage of the frequency detecting circuit shown in FIG. 3.

FIG. 5 illustrates a relationship between the frequency of the input signal 14 and the output voltage of the output signal S33 in the frequency detector 19. In FIG. 5, the output voltage increases in proportion to the frequency of the input signal S14.

Figure 6:
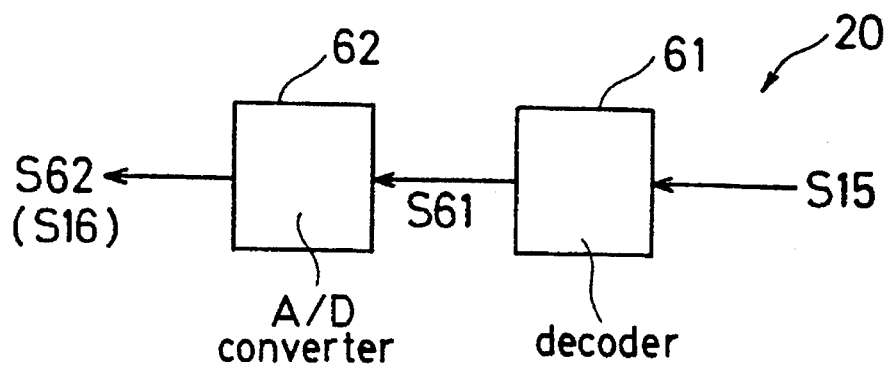
FIG. 6 is a block diagram illustrating a signal generator included in the transmitter of FIG. 1.

FIG. 6 is a block diagram illustrating the signal generator 20. The signal generator 20 comprises an analog/digital converter 61 receiving the output signal S15 of the frequency detector 19 and a decoder 62 receiving an output signal S61 of the analog/digital converter 61 and outputting a signal S62. The output signal S62 of the decoder 62 corresponds to the signal S16 of FIG. 1.

In this signal generator 20, the analog/digital converter 61 outputs the digital signal S61 according to the voltage of the input signal S15. The digital signal S61 is input to the decoder 62. The decoder 62 outputs the signal S62 that controls the switch circuit 18, i.e., the switch circuit 18 selects one of the filters 13a to 13n according to the signal S62.

A description is given of the operation.

The voltage controlled oscillator 17 receives an input signal S1 and outputs a signal S11 having a frequency in proportion to the voltage of the input signal S1. On the other hand, the frequency synthesizer 16 generates a signal S12 for converting the signal S11 into a signal having a frequency to be transmitted. The mixer 15 compounds the signal S11 and the signal S12 and outputs a signal S13. The voltage amplifier 14 amplifies the signal S13 and outputs a signal S14. The signal S14 is input to the switch circuit 18 and to the frequency detector 19. The frequency detector 19 detects a substantial communication frequency from the signal S14 and generates a voltage signal S15 corresponding to the detected frequency. The signal generator 20 generates a signal S16 for controlling the switch circuit 18 according to the voltage of the signal S15. When the switching control signal S16 is input to the switch circuit 18, one signal path of the switch circuit 18 is selected, and the signal S14 is guided to one of the filters 13a–13n that has a pass band including the detected substantial communication frequency and passes through the filter. In FIG. 1, the filter 13b is selected. Finally, a signal S17 output from the filter 13b is transmitted through the switch 12 and radiated into space from the antenna 11.

According to the first embodiment of the present invention, in the radio communication apparatus 100, the frequency detector 19 detects the substantial communication frequency from the output signal S14 of the voltage amplifier 14, and the signal generator 20 selects the band-pass filter 13b according to the result of the detection. The selected band-pass filter 13b has a pass band including a center frequency corresponding to the detected communication frequency and a width equivalent to the interval between adjacent communication frequencies in the usable frequency band of the communication apparatus. The signal S14 is transmitted through the selected band-pass filter 13b. Therefore, signals having frequencies different from the substantial communication frequency, which are generated in the voltage controlled oscillator 17, the frequency synthesizer 16, and the mixer 15 and included in the signal S14, are not radiated into space. As a result, this radio communication apparatus 100 does not cause noise in communication apparatus of the same kind and using communication frequencies different from that of the communication apparatus 100.

Figure 7:
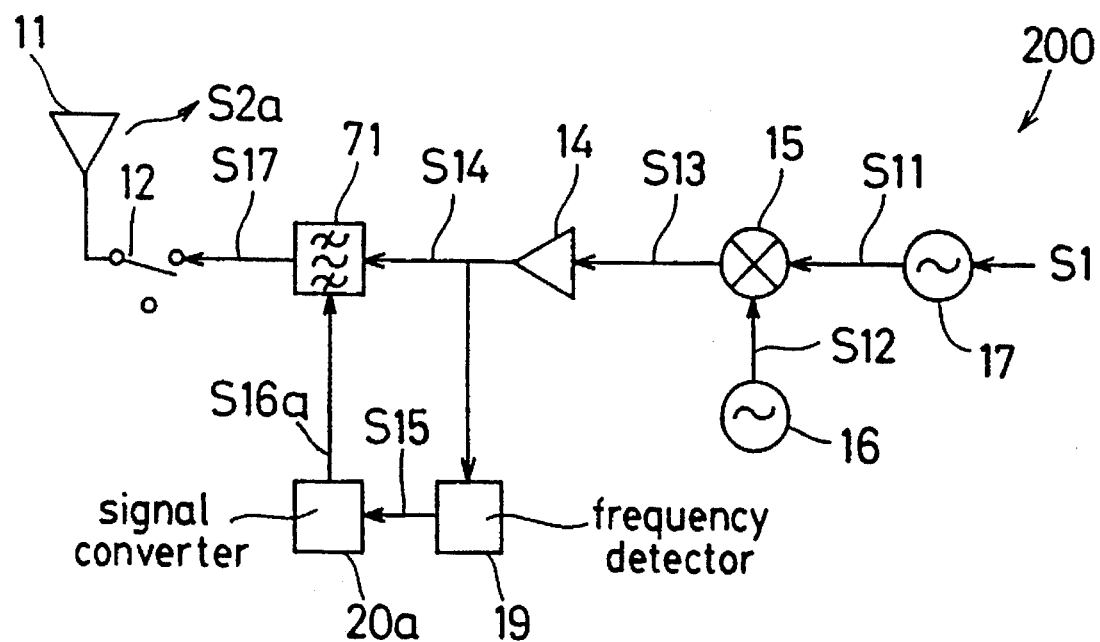
FIG. 7 is a circuit diagram illustrating a transmitter of a radio communication apparatus in accordance with a second embodiment of the present invention.

FIG. 7 is a circuit diagram illustrating a transmitter of a radio communication apparatus in accordance with a second embodiment of the present invention. In FIG. 7, the same reference numerals as in FIGS. 1 and 17 designate the same or corresponding parts. In a transmitter 200 according to this second embodiment, the output signal S14 from the power amplifier 14 is input to the frequency detector 19. The frequency detector 19 detects the substantial communication frequency from the signal S14 and generates a voltage signal S15 according to the detected frequency. A signal converter 20a receives the signal voltage S15 and outputs a signal S16a to a frequency variable band-pass filter 71. The frequency variable band-pass filter 71 changes its pass band according to the signal S16a so that the pass band is equal to the substantial communication frequency. In this second embodiment, the signal converter 20a performs only the level conversion of signals, differently from the analog/digital converter 62 according to the first embodiment.

Figure 8:
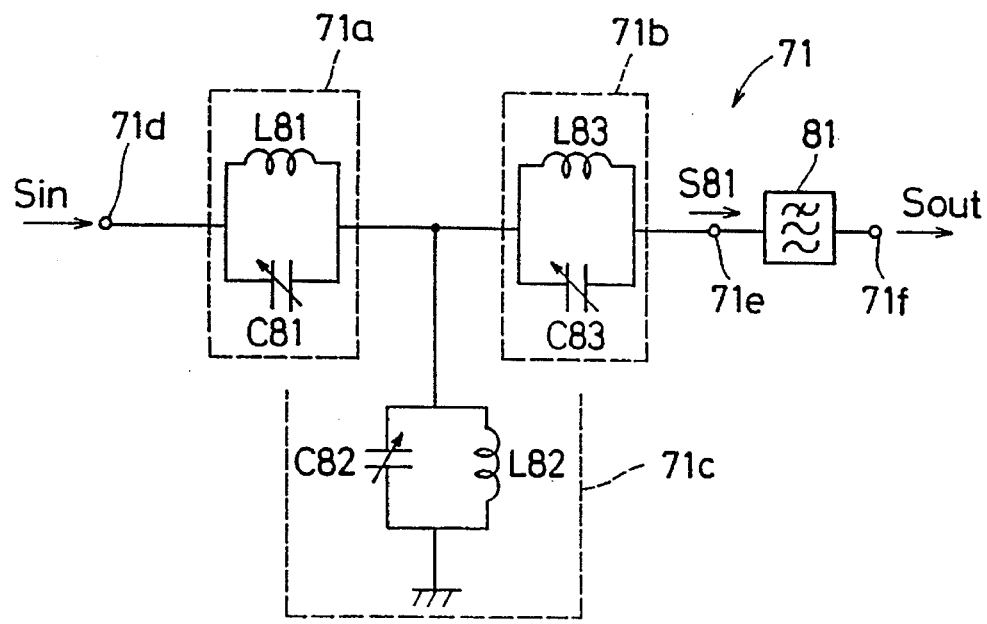
FIG. 8 is a circuit diagram illustrating a frequency variable band-pass filter included in the transmitter of FIG. 7.

FIG. 8 is a circuit diagram illustrating the frequency variable band-pass filter 71 shown in FIG. 7. In FIG. 8, the band-pass filter 71 includes three resonance circuits 71a to 71c. The resonance circuit 71a comprises an inductor L81 and a variable capacitor C81 which are connected in parallel with each other. An input end of the resonance circuit 71a is connected to an input terminal 71d. The resonance circuit 71b comprising an inductor L83 and a variable capacitor C83 which are connected in parallel is interposed between an output end of the resonance circuit 71a and an input end of a band-pass filter 81. The resonance circuit 71c comprising an inductor L82 and a variable capacitor C82 which are connected in parallel is interposed between a junction of the resonance circuits 71a and 71b and ground. The input signal $S_{in}$ corresponds to the signal S15 of FIG. 7, and the output signal $S_{out}$ corresponds to the signal S16b of FIG. 7. The variable capacitors C81 to C83 change the capacitances according to the voltage of the output signal 16a from the signal converter 20a.

Figure 9:
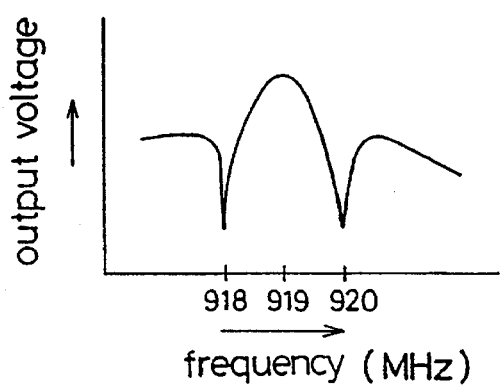
FIG. 9 is a diagram illustrating input frequency vs. output voltage characteristics of the frequency variable band-pass filter shown in FIG. 8.

Assuming that values of the inductors L81–L83 are 25 nH and values of the capacitors C81, C82, and C83 are respectively set at 1.204 nF, 1.2 nF, and 1.1976 pF by the voltage of the output signal 16a, the input signal $S_{in}$ passing through the frequency variable band-pass filter 71 has the characteristics shown in FIG. 9. That is, this band-pass filter 71 transmits a large quantity of signals having a frequency of 919 MHz and fewer signals having frequencies other than 919 MHz. Especially, this filter 71 hardly transmits signals having frequencies of 918 MHz and 920 MHz.

Figure 10:
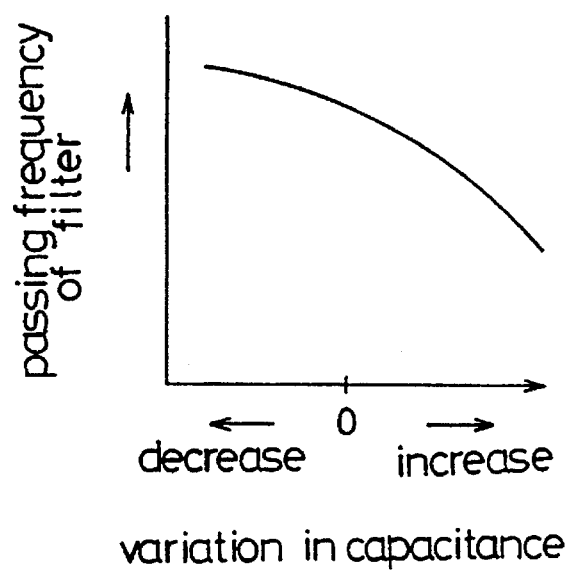
FIG. 10 is a diagram illustrating the relationship between a change in capacitance and passing frequency of the frequency variable band-pass filter shown in FIG. 8.

FIG. 10 illustrates the relationship between variations in capacitance in the band-pass filter 71 and the frequency passing through the filter 71. In FIG. 10, the abscissa shows variations in the capacitances of the capacitors C81, C82, and C83, and the ordinate shows the center value of the frequency passing through the filter.

Figure 17:
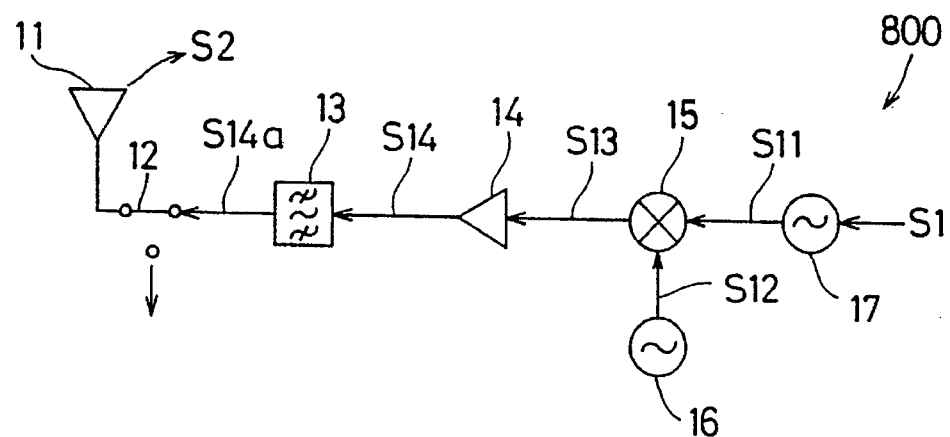
FIG. 17 is a circuit diagram illustrating a transmitter of a radio communication apparatus in accordance with the prior art.
Figure 18:
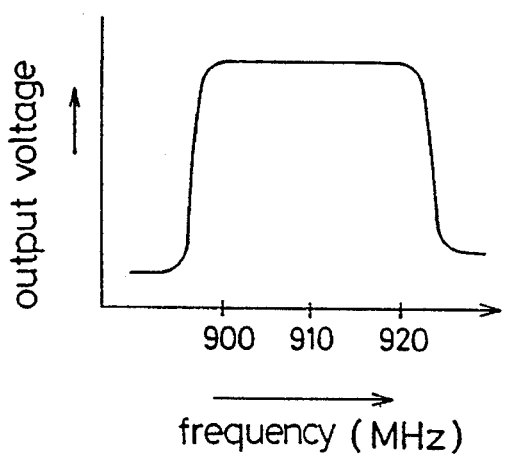
FIG. 18 is a diagram illustrating input frequency vs. output voltage characteristics of a band-pass filter included in the transmitter of FIG. 17.

In FIG. 8, the band-pass filter 81 has the same characteristics as the band-pass filter 13 shown in FIG. 17. This band-pass filter 81 may be dispensed with if desired attenuation of signals having frequencies other than the pass band is achieved by the resonance circuits 71a, 71b, and 71c.

In this radio communication apparatus according to the second embodiment of the present invention, the frequency detector 19 detects the substantial communication frequency from the output signal S14 of the power amplifier 14 and outputs the voltage signal S15 according to the substantial communication frequency. According to the voltage signal S15, the passing frequency of the variable band-pass filter 71 through which the signal S14 passes is changed to the substantial communication frequency. Therefore, signals having frequencies different from the substantial communication frequency, which are generated in the voltage controlled oscillator 17, the frequency synthesizer 16, and the mixer 15 and included in the signal S14, are not radiated into space, resulting in the same effects as in the first embodiment of the invention.

Figure 11:
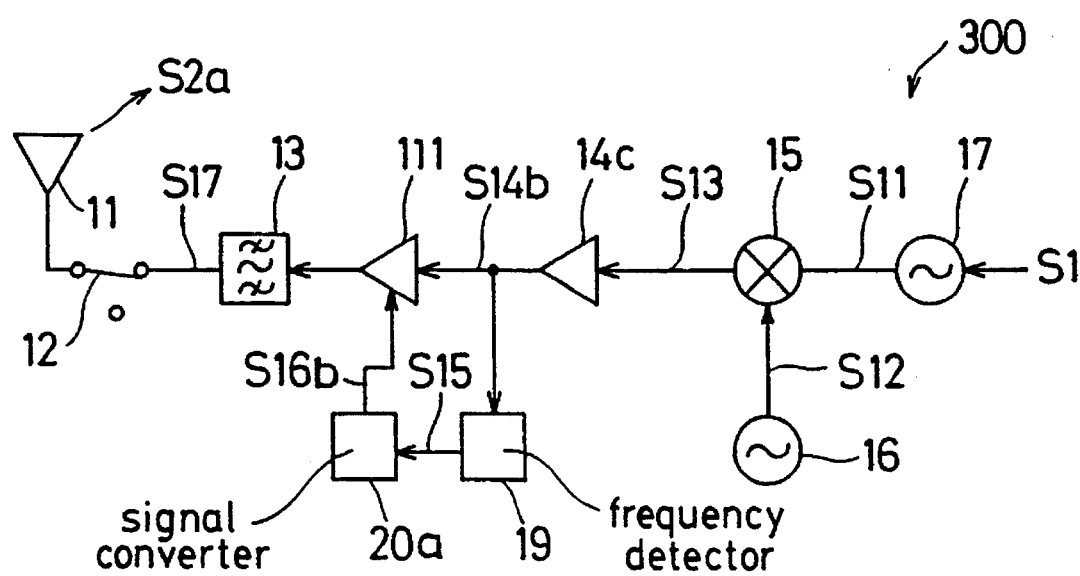
FIG. 11 is a circuit diagram illustrating a transmitter of a radio communication apparatus in accordance with a third embodiment of the present invention.

FIG. 11 is a circuit diagram illustrating a transmitter of a radio communication apparatus in accordance with a third embodiment of the present invention. In the figure, the same reference numerals as in FIGS. 1 and 17 designate the same or corresponding parts. In this transmitter, a signal S14b output from the power amplifier 14c is input to the frequency detector 19. The frequency detector 19 detects a substantial communication frequency from the signal S14b and generates a voltage signal S15 according to the detected frequency. The voltage signal S15 is input to the signal converter 20a. The signal converter 20a converts the voltage signal S15 into a signal S16b that changes the amplification band of the frequency variable power amplifier 111. Receiving the signal S16b, the power amplifier 111 has an amplification band that amplifies only the substantial communication frequency.

Figure 12:
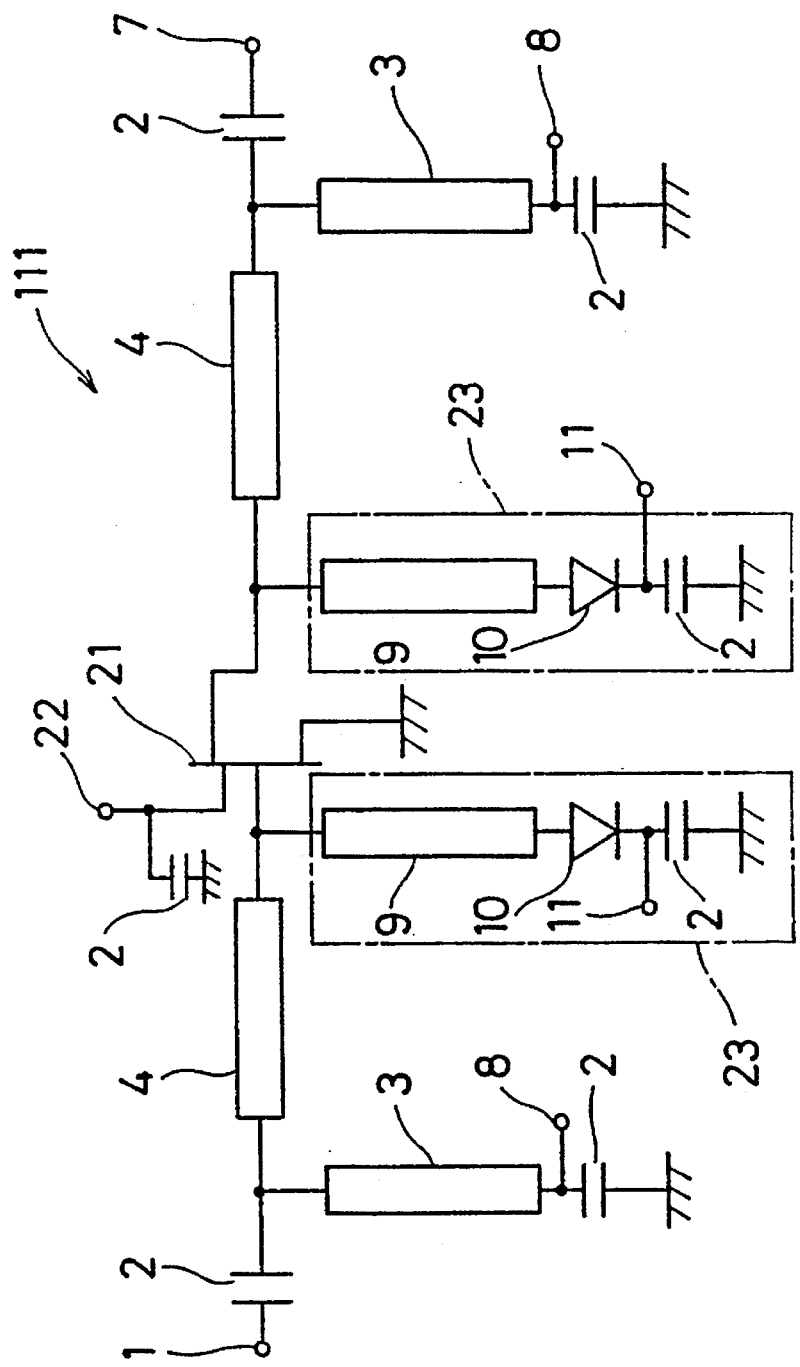
FIG. 12 is a circuit diagram illustrating an amplification frequency variable power amplifier included in the transmitter of FIG. 11.

FIG. 12 is a circuit diagram illustrating the frequency variable power amplifier 111. In FIG. 12, reference numeral 1 designates an input terminal, numeral 7 designates an output terminal, numeral 2 designates a DC blocking capacitor, numeral 3 designates a short stub, numeral 4 designates a main line, numeral 21 designates a dual gate FET having good isolation characteristics, and numeral 23 designates a phase controller. This circuit has a symmetrical structure with the dual gate GET 21 as the center of the symmetry. More specifically, an end of the short stub 3 is connected to a junction between the capacitor 3 and the main line 4, and the other end is grounded via the DC blocking capacitor 2. A gate of the dual gate FET 21 is connected to a gate bias terminal 22, and a junction between the gate and the gate bias terminal 22 is grounded via a DC blocking capacitor 2. A phase control circuit 23 is connected to a junction between another gate of the dual gate FET 21 and the main line 4, and another phase control circuit 23 is connected to a junction between a drain of the dual gate FET 21 and the main line 4. An end of each phase control circuit 23 opposite the end connected to the FET 21 is grounded. The phase control circuit 23 comprises a stripline 9, a diode 10, a bias terminal of the diode, and a DC current capacitor 2.

In this power amplifier 111, it is possible to control the input side phase and the output side phase separately from each other because of the good isolation characteristics of the dual gate FET 21. Therefore, the matching point can be changed regardless of the impedance of the FET, so that impedance matching is attained at a plurality of frequencies.

Since the radio transmitter 300 includes the additional power amplifier 111, the quantity of amplified power is increased as compared with the prior art transmitter 800. Therefore, the quantity of power amplified by the power amplifier 14c is reduced according to the increase in amplified power by the power amplifier 111.

In the radio communication apparatus according to this third embodiment of the invention, the frequency detector 19 detects the substantial communication frequency from the output signal S14b of the power amplifier 14c and generates the voltage signal S15 according to the substantial communication frequency. According to the voltage signal S15, the amplification band of the frequency variable power amplifier 111 that amplifies the signal S14b is changed to the substantial communication frequency. Therefore, signals included in the signal S14 and having frequencies different from the substantial communication frequency are eliminated by the frequency variable power amplifier 111, resulting in the same effects as in the first embodiment of the invention.

Figure 13:
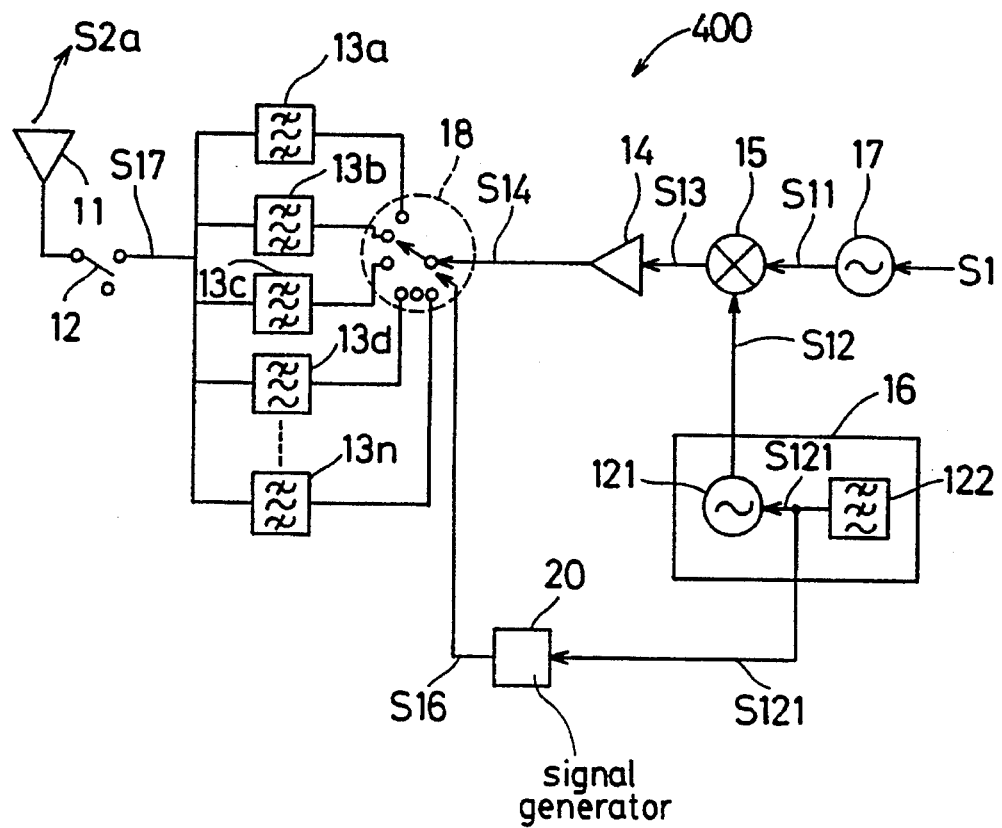
FIG. 13 is a circuit diagram illustrating a transmitter of a radio communication apparatus in accordance with a fourth embodiment of the present invention.

FIG. 13 is a circuit diagram illustrating a transmitter of a radio communication apparatus in accordance with the fourth embodiment of the present invention. In the figure, the same reference numerals as in FIGS. 1 and 17 designate the same or corresponding parts. In this transmitter, the frequency synthesizer 16 includes a loop filter 122 that determines the oscillation frequency of the voltage controlled oscillator 121. A voltage signal S121 output from the loop filter 122 is input to the signal generator 20. The signal generator 20 generates a signal S16 that controls the switch circuit 18 according to the voltage of the voltage signal S121. That is, in this transmitter, the frequency synthesizer 16 generates the signal S12 that determines the substantial communication frequency in proportion to the voltage signal S121 output from the loop filter 122, so that the substantial communication frequency is detected by the voltage signal S121 output from the loop filter 122. In this structure, the voltage signal S12 output from the loop filter 122 serves as the signal S15 output from the frequency detector 19 of the transmitter according to the first embodiment.

In the radio communication apparatus according to the fourth embodiment of the present invention, the same effects as described in the first embodiment of the invention are achieved. Further, since the frequency detector of the first embodiment that detects the substantial communication frequency from the output signal S14 of the power amplifier 14 is dispensed with, the size of the apparatus is reduced.

Figure 14:
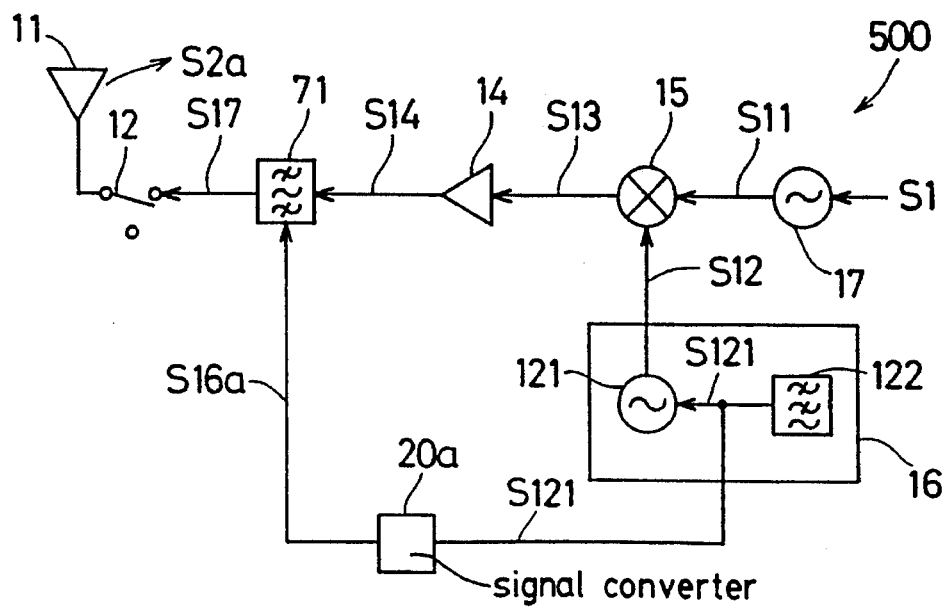
FIG. 14 is a circuit diagram illustrating a transmitter of a radio communication apparatus in accordance with a fifth embodiment of the present invention.

FIG. 14 is a circuit diagram illustrating a transmitter of a radio communication apparatus in accordance with a fifth embodiment of the present invention. In the figure, the same reference numerals as in FIGS. 7 and 13 designate the same or corresponding parts. In the radio transmitter 500 of this fifth embodiment, the transmitter 200 according to the second embodiment and the transmitter 400 according to the fourth embodiment are combined. That is, as in the transmitter 400 of the fourth embodiment, the substantial communication frequency is detected using the voltage signal S121 output from the loop filter 121 included in the frequency synthesizer 16, and the pass-band of the frequency variable band-pass filter 71 is changed according to the voltage signal S121.

In the radio communication apparatus according to this fifth embodiment, the same effects as in the above-described second embodiment are achieved. Further, since the frequency detector that detects the substantial communication frequency from the output signal S14 of the power amplifier 14 is dispensed with, the size of the apparatus is reduced.

Figure 15:
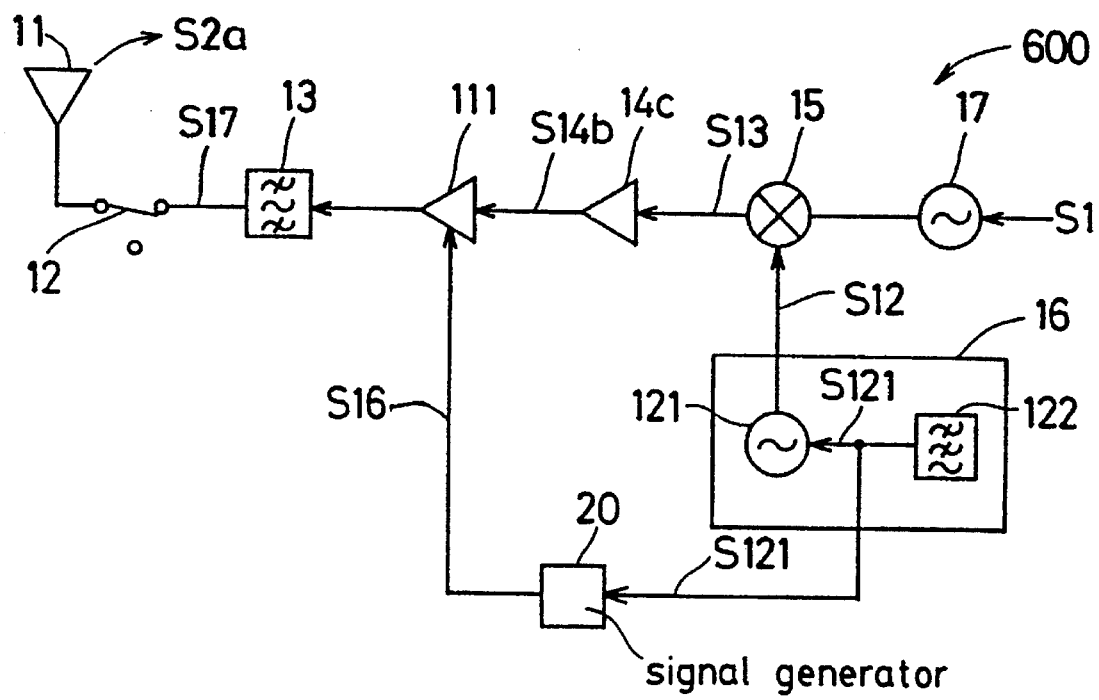
FIG. 15 is a circuit diagram illustrating a transmitter of a radio communication apparatus in accordance with a sixth embodiment of the present invention.

FIG. 15 is a circuit diagram illustrating a transmitter of a radio communication apparatus in accordance with a sixth embodiment of the present invention. In the figure, the same reference numerals as in FIGS. 11 and 13 designate the same or corresponding parts. In the radio transmitter 600 of this sixth embodiment, the transmitter 300 according to the third embodiment and the transmitter 400 according to the fourth embodiment are combined. As in the transmitter 400 of the fourth embodiment, the substantial communication frequency is detected using the voltage signal S121 output from the loop filter 121 included in the frequency synthesizer, and the amplification frequency of the frequency variable power amplifier 111 is changed according to the voltage signal 121.

In the radio transmitter of this sixth embodiment, the same effects as in the above-described third embodiment are achieved. Further, since the frequency detector that detects the substantial communication frequency from the output signal S14 of the power amplifier 14 is dispensed with, the size of the apparatus is reduced.

Figure 16:
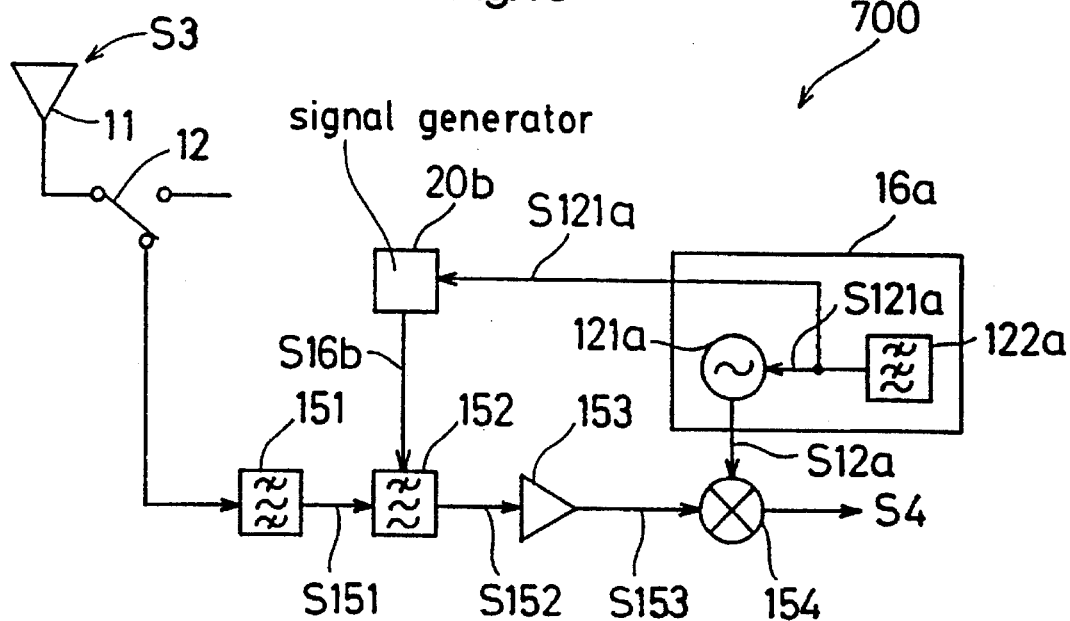
FIG. 16 is a circuit diagram illustrating a receiver of a radio communication apparatus in accordance with a seventh embodiment of the present invention.

FIG. 16 is a circuit diagram illustrating a receiver of a radio communication apparatus in accordance with a seventh embodiment of the present invention. In the receiver 700, a signal S3 received by a receiving antenna 11a passes through a band-pass filter 151, and signals having frequencies other than the usable frequency band are eliminated by the band-pass filter 151, producing a signal S151. The signal S151 passes through a passing frequency variable band-pass filter 152. On the other hand, a frequency synthesizer 16a including a loop filter 122a outputs a signal S12a that is in proportion to a voltage signal S121 output from the loop filter 122a and determines the substantial communication frequency, and the signal S12a is input to a mixer 154. A signal generator 20b receives the voltage signal S121a and determines a passing frequency of the passing frequency variable band-pass filter 152 according to the voltage signal 121a. Therefore, when the signal S151 passes through the passing frequency variable band-pass filter 152, signals having frequencies other than the substantial communication frequency are eliminated from the signal S151, resulting in a signal S152. The signal S152 is amplified in a low-noise amplifier 153. An output signal S153 from the low-noise amplifier 153 and the signal S12a output from the frequency synthesizer 16a are input to a mixer 154, and the mixer 154 outputs a demodulated signal S4.

In the transmitters according to the first to sixth embodiments of the invention, signals having frequencies different from the substantial communication frequency are not radiated into space. On the other hand, in the receiver 700 of this seventh embodiment, signals having frequencies different from the substantial communication frequency are eliminated through the band-pass filter 152, and the remaining signals having the substantial communication frequency are demodulated.

In the receiver according to this seventh embodiment of the invention, since the passing frequency of the passing frequency variable band-pass filter 152 is controlled by the voltage signal S121a output from the loop filter 122a included in the frequency synthesizer 16a, useless signals included in the signal S151 and having frequencies other than the substantial communication frequency are eliminated by the band-pass filter 152. Therefore, the signal S152 having less noise is produced, resulting in a favorable demodulated signal S4.

The receiver 700 shown in FIG. 16 is obtained by rearranging the transmitter shown in FIG. 14 as a receiver. Likewise, the structure of the transmitter 400 shown in FIG. 13 or the structure of the transmitter 600 shown in FIG. 15 may be applied to a receiver.

What is claimed is:

1. A transmitter of a radio communication apparatus including:

means for receiving and for converting an input signal having a voltage input to the transmitter into a frequency signal having a frequency indicative of the voltage;

means for receiving the frequency signal, connected to the means for receiving and for converting, and for mixing a signal having an oscillation frequency with the frequency signal and for generating a mixed signal for transmission that has a transmission frequency at which communication is carried out;

means for receiving the mixed signal, connected to the means for receiving the frequency signal, and for detecting the transmission frequency from the mixed signal and for generating an output signal indicative of the transmission frequency;

a plurality of band-pass filters having different center frequencies, each center frequency corresponding to one of a plurality of communication frequencies spaced apart at an interval in a usable frequency band of the transmitter, each band-pass filter having a pass band width equal to the interval between adjacent communication frequencies; and means for switching, connected to the means for receiving the mixed signal and to the means for receiving the frequency signal, for connecting the mixed signal to one of the band-pass filters, in response to the output signal, so that the mixed signal passes through the one of the band-pass filters that has a center frequency corresponding to the transmission frequency.

2. A transmitter of a radio communication apparatus including:

means for receiving and for converting an input signal having a voltage input to the transmitter into a frequency signal having a frequency indicative of the voltage;

means for receiving the frequency signal, connected to the means for receiving and for converting, and for mixing a signal having an oscillation frequency with the frequency signal and for generating a mixed signal for transmission that has a transmission frequency at which communication is carried out;

means for receiving the mixed signal, connected to the means for receiving the frequency signal, and for detecting the transmission frequency from the mixed signal and for generating an output signal indicative of the transmission frequency;

a power amplifier, connected to the means for receiving the frequency signal, for amplifying signals within a frequency range that varies in response to an applied voltage signal for amplifying the mixed signal; and means for controlling the amplification frequency range of the power amplifier to coincide with the transmission frequency, connected to the power amplifier and to the means for receiving the mixed signal, for controlling the frequency range, in response to the output signal, to include the transmission frequency.

3. A transmitter of a radio communication apparatus including:

means for receiving and for converting an input signal having a voltage input to the transmitter into a frequency signal having a frequency indicative of the voltage;

a signal synthesizer including a loop filter for generating a signal having a synthesized frequency;

means for receiving, connected to the means for receiving and for converting and to the signal synthesizer and for mixing the signal having a synthesized frequency with the frequency signal and for generating a mixed signal for transmission that has a transmission frequency at which communication is carried out;

a power amplifier, connected to the means for receiving and for mixing, for amplifying signals within a frequency range that varies in response to an applied voltage signal for amplifying the mixed signal;

means for controlling the amplification frequency range of the power amplifier to coincide with the transmission frequency according to an output signal from the loop filter, connected to the power amplifier and to the signal synthesizer, for controlling the frequency range, in response to the output signal, to include the transmission frequency.

* * * * *